United States Patent
Qiu et al.

(10) Patent No.: US 9,698,364 B2
(45) Date of Patent: Jul. 4, 2017

(54) ORGANIC THIN FILM TRANSISTOR, PREPARING METHOD THEREOF, AND PREPARATION EQUIPMENT

(71) Applicant: BOE Technology Group Co., Ltd., Beijing (CN)

(72) Inventors: Longzhen Qiu, Beijing (CN); Xiang Feng, Beijing (CN); Xianghua Wang, Beijing (CN); Ze Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 43 days.

(21) Appl. No.: 14/388,544

(22) PCT Filed: Apr. 7, 2013

(86) PCT No.: PCT/CN2013/073772
§ 371 (c)(1),
(2) Date: Sep. 26, 2014

(87) PCT Pub. No.: WO2014/131220
PCT Pub. Date: Sep. 4, 2014

(65) Prior Publication Data
US 2015/0060800 A1     Mar. 5, 2015

(30) Foreign Application Priority Data
Feb. 27, 2013   (CN) .......................... 2013 1 0062429

(51) Int. Cl.
*H01L 51/05*     (2006.01)
*B05C 1/00*     (2006.01)
*H01L 51/00*     (2006.01)

(52) U.S. Cl.
CPC ............ *H01L 51/0545* (2013.01); *B05C 1/00* (2013.01); *H01L 51/0003* (2013.01);
(Continued)

(58) Field of Classification Search
CPC ............. H01L 51/0545; H01L 51/0003; H01L 51/0096; H01L 51/0094; H01L 51/0055; B05C 1/00
(Continued)

(56) References Cited

U.S. PATENT DOCUMENTS

| 7,514,710 B2* | 4/2009 | Vogel .................. H01L 51/0055 257/17 |
| 2005/0185975 A1* | 8/2005 | Kobayashi .......... G03G 15/0844 399/44 |

(Continued)

FOREIGN PATENT DOCUMENTS

| CN | 1812153 A | 8/2006 |
| CN | 1960022 A | 5/2007 |

(Continued)

OTHER PUBLICATIONS

International Search Report mailed Nov. 28, 2013 (PCT/CN2013/073772); ISA/CN.
(Continued)

*Primary Examiner* — Cuong Q Nguyen
*Assistant Examiner* — Nishath Yasmeen
(74) *Attorney, Agent, or Firm* — Banner & Witcoff, Ltd.

(57) ABSTRACT

An organic thin film transistor, a preparing method thereof, and a preparation equipment. The preparation equipment of an organic thin film transistor comprises: forming a gate electrode, a gate insulating layer, an organic semiconductor layer, and source-drain electrodes on a substrate; the step of forming the organic semiconductor layer comprises: blade-coating a solution in which an organic semiconductor material used to forming the organic semiconductor layer is dissolved to form the organic semiconductor layer. The preparing method can avoid the difference between the edge and the center of the substrate caused by the impact of
(Continued)

centripetal force when a spin-coating method is applied, so that the yield of the organic thin film transistor devices is improved.

18 Claims, 7 Drawing Sheets

(52) U.S. Cl.
CPC ...... *H01L 51/0096* (2013.01); *H01L 51/0055* (2013.01); *H01L 51/0094* (2013.01)

(58) Field of Classification Search
USPC .......................................................... 257/40
See application file for complete search history.

(56) References Cited

U.S. PATENT DOCUMENTS

| 2006/0145148 | A1 | 7/2006 | Hirai et al. |
| 2006/0162650 | A1* | 7/2006 | Kido .................. H01L 51/0004 118/305 |
| 2007/0105396 | A1 | 5/2007 | Li et al. |
| 2007/0158643 | A1 | 7/2007 | Vogel et al. |
| 2007/0243658 | A1* | 10/2007 | Hirai .................. H01L 51/0004 438/99 |
| 2009/0256144 | A1* | 10/2009 | Kano .................. H01L 51/0012 257/40 |
| 2010/0034736 | A1 | 2/2010 | Sanchez-Garcia et al. |
| 2011/0281393 | A1 | 11/2011 | He et al. |
| 2012/0034736 | A1 | 2/2012 | Wu et al. |
| 2012/0313086 | A1* | 12/2012 | Sadamitsu ........... C07D 495/04 257/40 |

FOREIGN PATENT DOCUMENTS

| CN | 101346808 A | 1/2009 |
| CN | 102527589 A | 7/2012 |
| JP | 2010-010525 A | 1/2010 |

OTHER PUBLICATIONS

Nov. 23, 2015—(CN) Fourth Office Action Appn 201310062429.9 with English Tran.
Sep. 1, 2015 (WO) International Preliminary Report on Patentability—App No. PCT/CN2013/073772.
Aug. 26, 2015 (CN) Third Chinese Office Action with English Translation—App. No. CN201310062429.9.
Feb. 4, 2014—(CN) Office Action—App CN 201310062429.9—English Translation.
Jun. 3, 2015—(CN) Second Office Action for Appn 201310062429.9 with Eng Tran.

* cited by examiner

ORGANIC THIN FILM TRANSISTOR, PREPARING METHOD THEREOF, AND PREPARATION EQUIPMENT

This application is a U.S. National Phase Entry of International Application PCT/CN2013/073772 filed on Apr. 7, 2013, designating the United States of America and claiming priority to Chinese Patent Application No. 201310062429.9, filed on Feb. 27, 2013. The present application claims priority to and the benefit of all the above-identified applications and all of the above-identified applications are incorporated by reference herein in their entireties.

TECHNICAL FIELD

Embodiments of the present invention relate to an organic thin film transistor, a preparing method thereof, and a preparation equipment.

BACKGROUND

An organic thin film transistor (OTFT) is a semiconductor device which uses an organic semiconductor material in place of a conventional silicon semiconductor material. Compared with silicon based materials, an organic material is difficult to fabricate and of high-cost. However, an organic material can be prepared to be in a solution, and used to prepare semiconductor devices under mild conditions, and thus it receives more attention, and has become a core element in the next-generation display technology. At present, Samsung, Sony and many other display manufactures have conducted the development of integrated circuits based on organic thin film transistors. An organic thin film transistor, by virtue of its flexible characteristics, becomes an indispensable technical element in a foldable display and a panoramic display screen.

Since an organic semiconductor thin film usually has a relative large volume conductivity, if the organic semiconductor thin films of thin film transistor devices in an integrated circuit are interconnected with each other, then, on the one hand, it is easy to generate crosstalk between adjacent devices, and on the other hand, the leakage electric-current of the devices will greatly increase, resulting in decrease of ON/OFF current ratio. These problems seriously hindered the applications of OTFT devices in large-area arrays and integrated circuits.

Dewetting-patterning method is a process conducted by changing the surface energy of a substrate, so that an organic solution of a semiconductor material can be selectively remained on the surface of the substrate, achieving the patterning of a semiconductor thin film. This method can uniformly alter the surface energy of the substrate, such as difference among contact-angles on the entire surface of the substrate at various regions is within 5°, can be used to prepare micro-patterns of high precision, and has characteristics of fast preparation and mild preparation environment, etc., and thus has attained the attention of academia and become the research focus of pattering semiconductor materials.

At present, the organic solution of an semiconductor material is coated on the surface of the substrate mainly by adopting a drop standing method and a spin-coating method. The devices fabricated by the drop standing method possess a fatal flaw in the structure, because the semiconductor material is prepared in a solution, the flowing solution cannot stay in the regions with low surface energy, but stays in the regions with high surface energy. However, the regions with high surface energy of the substrate have a lot of hydrophilic hydroxyl groups, and these groups may react with carriers, so that carrier traps are generated and the mobilities of the carriers are hindered, thus the performance of the device is largely lowered and a big lag phenomenon exists.

SUMMARY

Embodiments of the present invention relate to an organic thin film transistor, a preparing method thereof, and a preparation equipment, which are used to reduce the difference between different positions on the surface of the substrate to improve the yield of devices.

An aspect of the present invention provides a preparing method of an organic thin film transistor, comprising: forming a gate electrode, a gate insulating layer, an organic semiconductor layer, and source-drain electrodes on a substrate; the step of forming the organic semiconductor layer comprises: blade-coating a solution in which an organic semiconductor material used to form the organic semiconductor layer is dissolved to form the organic semiconductor layer.

For example, in the method, during blade-coating the solution in which an organic semiconductor material used to form the organic semiconductor layer is dissolved to form the organic semiconductor layer, all contact points of the blade and the substrate have the sane linear velocity.

For example, in the method, the linear velocity may be any velocity selected from 0.5 mm/s~5 cm/s.

For example, the linear velocity is 5 mm/s.

For example, in the method, before forming the organic semiconductor layer, it may further comprise: forming a hydrophilic region and a hydrophobic region on the substrate.

For example, in the method, forming the gate electrode, the gate insulating layer, the organic semiconductor layer, and the source-drain electrodes on the substrate may comprise: forming the gate electrode on the surface of the substrate; covering the gate insulating layer onto the surface of the substrate with the gate electrode being formed thereon; forming the organic semiconductor layer on the surface of the gate insulating layer; and forming source-drain electrodes on the surface of the organic semiconductor layer.

For example, in the method, forming the gate electrode, the gate insulating layer, the organic semiconductor layer, and the source-drain electrodes may comprise: forming the source-drain electrodes on the surface of the substrate; covering the organic semiconductor layer onto the surface of the substrate with the source-drain electrodes being formed thereon; forming the gate insulating layer on the surface of the organic semiconductor layer; and forming the gate electrode on the surface of the surface of the gate insulating layer.

For example, in the method, a high molecule polymer insulating material may be further dissolved in the solution.

For example, in the method, the organic semiconductor material is 6,13-bis(triisopropylsilyl ethynyl)pentacene, the high molecule polymer insulating material is polymethyl methacrylate or polystyrene, a mass ratio of the 6,13-bis(triisopropylsilyl ethynyl)pentacene to the high molecule polymer insulating material is 1:1, and a total mass concentration percentage of the 6,13-bis(triisopropylsilyl ethynyl) pentacene and the high molecule polymer insulating material is 2% in the solution.

For example, in the method, a solvent of the solution may be chlorobenzene or dichlorobenzene.

For example, in the method, the substrate may be a silicon substrate, a glass substrate, or a plastic substrate.

Another aspect of the present invention provides an organic thin film transistor, which comprises an organic semiconductor layer; the organic semiconductor layer is prepared through the above-mentioned preparing method of an organic thin film transistor.

For example, the organic thin film transistor may comprise a gate electrode, a gate insulating layer, the organic semiconductor layer and source-drain electrodes, which are sequentially arranged on the substrate, or comprise source-drain electrodes, the organic semiconductor layer, a gate insulating layer and a gate electrode, which are sequentially arranged on the substrate.

The method for preparing an organic thin film transistor according the present embodiment of the present invention is particularly suitable for preparing a large size patterned organic thin film transistor array.

Yet another aspect of the present invention further relates to applications of the preparing method of an organic thin film transistor in manufacturing display devices.

Yet another aspect of the present invention provides a preparation equipment applied for the preparing method of an organic thin film transistor, comprising: a blade and a movement control device; the movement control device is used to control the blade to contact the substrate and control the blade to move relatively to the substrate; the solution, in which an organic semiconductor material used to form the organic semiconductor layer is dissolved, is blade-coated with the blade to form the organic semiconductor layer on the substrate and making the linear velocity of all contact points of the blade and the substrate be the same.

For example, in the preparation equipment, the movement control device may comprise: a fixture for fixing the blade and a conveyor for placing the substrate thereon.

For example, in the preparation equipment, the blade may be a silicon rubber blade.

For example, in the preparation equipment, a side of the blade towards the substrate is provided with a liquid dropping outlet.

In the organic thin film transistor and the preparing method thereof of the embodiments of the present invention, because the use of a blade-coating process, the solution of the organic semiconductor material moves on the substrate under the action of the same transverse shear force, and the thickness of the solution on the substrate is uniform; therefore, the devices in each row or each column of the dot matrix of the substrate are formed in a synchronous manner, so the differences between the crystalline directions of the organic semiconductor material in each row or each column are not large, the yield of the device is largely improved and the performance of the device has a relatively better homogeneity.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DRAWING REFERENCE NUMBERS

1—blade; 2—conveyor; 3—substrate; 4—solution; 5—hydrophilic region; 6—hydrophobic region; 7—substrate; 8—gate electrode; 9—gate insulating layer; 10—organic semiconductor layer; 11—source electrode; 12—drain electrode; 13—fixture; 14—liquid dropping outlet.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, technical jargon or scientific terms used herein should be interpreted in the usual sense as understood by those ordinary skilled in the relevant art of the present invention. The terms "first", "second", and the like that are used in the specification and claims of this patent application of the invention, do not denote any order, quantity, or importance, but are used to distinguish among different integral parts. Likewise, the words "a", "an", "the" or the like, herein do not denote a limitation of quantity, but denote the presence of at least one of the referenced item. The words "comprising" or "including" or the like refers to that the elements or objects that appear before the word "comprising" or "including" encompass the elements or objects and their equivalents that are enumerated after the word "comprising" or "including" and do not exclude other elements or objects. The terms "connection" or "couple" or the like are not limited to physical or mechanical connections, but may comprise electrical connection, whether direct or indirect. The terms "on", "under", "left", "right" and the like are only used to indicate a relative positional relationship, which may be varied with a change of an absolute position of a described object.

As for the defect of lag phenomenon in the prior art, the inventors have proposed that the separation between a semiconductor material and a high molecule polymer insulating layer is used to insert a high molecule polymer interfacial modification layer between the semiconductor layer and a gate insulating layer, thereby avoiding carrier traps due to the hydroxyl groups on the gate insulating layer, so that good device performance is obtained and the lag phenomenon is largely lowered; this can be understood from Chinese Patent Application No.: 201210102398.0, which is entirely incorporated herein by reference. However, during the implementation of such a method, when a spin-coating method is used to prepare a thin film, the difference between the linear velocity at the center of a substrate and the linear velocity at an edge or a corner of the substrate is large. Due to a relatively small linear velocity at the center of the substrate, the thin film in this region is in a steady spinning state during the crystallization process, formation of the thin film and the separation behavior between the semiconductor material and the high molecule polymer can be better conducted, as a result, the performance of the device is relatively good. However, the thin film at an edge and a corner of the substrate is in a revolution state with a large linear velocity, such state is unfavorable for spreading the semiconductor material, and the revolution will make the crystalline directions of the semiconductor material disorganized, and even an uneven, incomplete thin film is formed; so the performance of the device is largely decreased, and some devices even do not have desirable performance, i.e., a high rate of defect points. This leads to a great gap between the performance of the devices at the center and the edge of the substrate of the device, which results a low yield. Moreover, the larger the size of the substrate is, the more obvious such gap is. On the other hand, a spin-coating method will throw away most of the solution of the raw material, resulting in the waste of the raw materials. Furthermore, a spin-method is difficult to be applied to a flexible substrate. Based on the above several factors, such preparing method is still difficult to achieve industrial applications.

In the above technique, due to the use of a spin-coating process, the difference between the velocity at the center of the substrate and the velocity at an edge of the substrate result in a larger gap between the center and the edge and relatively poor uniformity, which leads to disorganized crystalline directions of the semiconductor material and a low device yield.

With respect to the technical problem of a low yield of the products caused by the large deference of the crystallization of the organic thin film at different positions when a spin-coating method is used, embodiments of the present invention provide an organic thin film transistor, a preparing method thereof, and a preparation equipment. In the technical solutions of the embodiments of the present invention, a blade-coating process is used, so that the solution of an organic semiconductor material is moved on a substrate under the action of the same transverse shear force, the thickness of the solution on the surface of the substrate maintains uniform, and the devices of each row or each column of the array on the substrate are formed synchronously; therefore, the difference between the crystalline directions of the small molecule organic semiconductor material of each row or each column is not large and the yield of the devices is largely improved.

Figure 12:
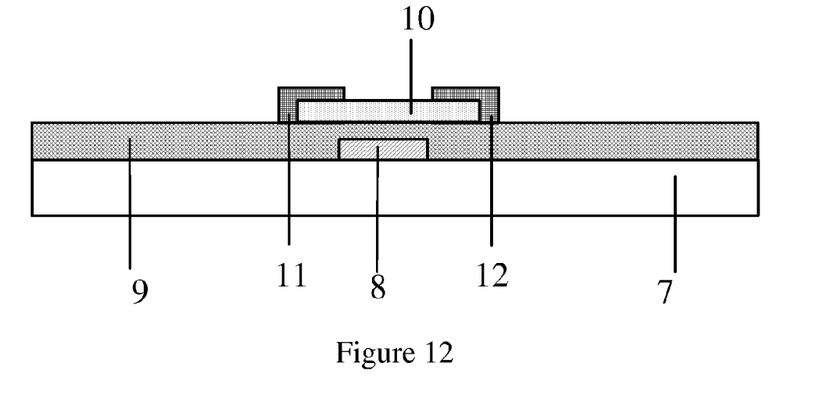
FIG. 12 is a schematic structural diagram of an organic thin film transistor provided by one embodiment of the present invention.

Referring to FIG. 12, a preparing method of an organic thin film transistor according to an embodiment of the present invention, comprising: forming a gate electrode 8, a gate insulating layer 9, an organic semiconductor layer 10, and source-drain electrodes 11,12 on a substrate 7; the step of forming the organic semiconductor layer comprises: blade-coating the solution in which an organic semiconductor material used to form the organic semiconductor layer is dissolved to form the organic semiconductor layer.

In the technical solutions of the embodiments of the present invention, blade-coating a prepared solution on a substrate by a blade-coating process, the blade may be moved in a linear movement manner to conduct blade-coating on the substrate, and also may be moved in a spinning manner to conduct blade-coating on the substrate; during the whole blade-coating process, the blade makes transverse shear force uniform and makes the thickness of the solution on the substrate uniform, so that each device stays in the equal state; this method avoids the difference between the center and the edge caused by that the solution is thrown away from inner to outside in a spin-coating process, and improves the yield of the organic thin film transistor devices.

For example, during the process of blade-coating the solution in which an organic semiconductor material used to form the organic semiconductor layer is dissolved to form the organic semiconductor layer, all contact points of the blade and the substrate are at the same linear velocity.

In the technical solutions of the embodiments of the present invention, since all contact points of the blade and the substrate are all the same linear velocity, when the blade conducts blade-coating on the surface of the substrate, the stay time of the solution on each device on the substrate is consistent, thereby preferably ensuring the uniformity of the blade-coating and improving the yield of the organic thin film transistor devices.

For example, the linear velocity may be any velocity selected from the range of 0.5 mm/s~5 cm/s; preferably, the linear velocity is 5 mm/s.

During the blade-coating, the advancing velocity of the blade shall not be too fast, because too fast advancing velocity will affect the crystalline performance of the organic solution that is blade-coated on the substrate; and the advancing velocity of the blade shall not be too slow, because too low velocity will affect the productivity. Therefore, the velocity may be any one selected from the range of 0.5 mm/s~5 cm/s, and for example, a velocity of 5 mm/s is selected to blade-coat the organic solution onto the substrate.

For example, before forming the organic semiconductor layer, the method may further comprise: forming a hydrophilic region and a hydrophobic region on the substrate.

In the embodiments of the present invention, one type of the substrate is of a bottom gate structure, i.e., a gate electrode and a gate insulation layer have been prepared before preparing the organic semiconductor layer; a mask is used in the surface treatment on the substrate with the gate insulation layer being prepared on, such as using a ultraviolet ozone cleaning apparatus for the surface treatment onto the substrate, so that a hydrophilic region is formed in a region of the surface of the substrate corresponding to the transmissive region of the mask and a hydrophobic region is formed in a region of the surface of the substrate corresponding to the non-transmissive region of the mask. Another type of the substrate is a top gate structure, i.e., source-drain electrodes have been prepared before preparing the organic semiconductor layer, using a mask for the surface treatment on the substrate with source-drain electrodes being prepared on, such as using a ultraviolet ozone cleaning apparatus for the surface treatment of the substrate, so that a hydrophilic region is formed in a region of the surface of the substrate corresponding to the transmissive region of the mask and a hydrophobic region is formed in a region of the surface of the substrate corresponding to the non-transmissive region of the mask. The prepared organic solution is blade-coated on the substrate through a blade-coating process, and the solution stays in the hydrophilic region of the substrate, forming an organic semiconductor layer. During the whole blade-coating process, the residence time and the shear force of the solution at the hydrophilic region in each row or each column of the substrate are consistent, and each device is in a equal state, thereby avoiding the differences between the center and the edge of the substrate when a spin-coating process is applied and improving the yield of the organic thin film transistor devices.

For example, the step of forming a gate electrode, a gate insulating layer, an organic semiconductor layer and source-drain electrodes on a substrate comprises: forming a gate electrode on the substrate; covering a gate insulating layer on the surface of the substrate with the gate electrode being formed on; forming the organic semiconductor layer on the surface of the gate insulating layer; and forming source-drain electrodes on the surface of the organic semiconductor layer.

In the embodiments of the present invention, the organic semiconductor layer of the organic thin film transistor having a bottom gate structure is formed by a blade-coating process.

Figure 13:
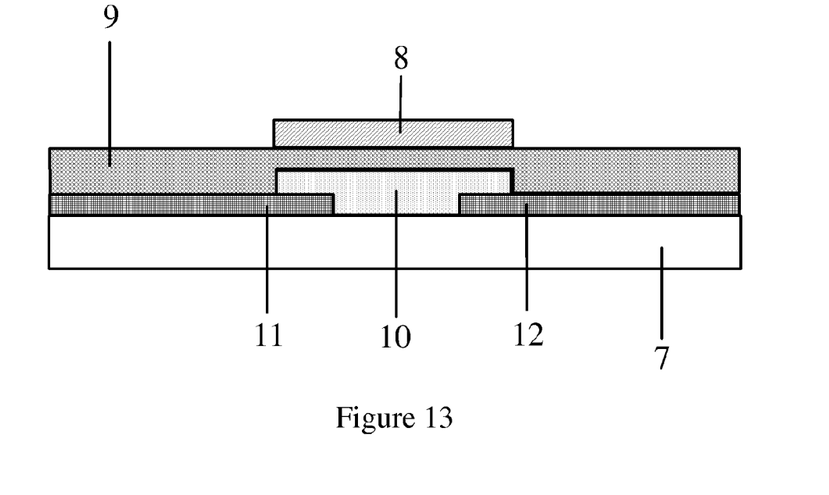
FIG. 13 is a schematic structural diagram of an organic thin film transistor provided by another embodiment of the present invention.

For another example, referring to FIG. 13, the step of forming a gate electrode 8, a gate insulating layer 9, an organic semiconductor layer 10, and source-drain electrodes 11,12 on a substrate 7 comprises: forming source-drain electrodes 11,12 on the substrate 7; covering the organic semiconductor layer 10 on the substrate 7 with the source-drain electrodes 11,12 being formed on; forming the gate insulating layer 9 on the surface of the organic semiconductor layer 10; and forming the gate electrode 8 on the surface of the gate insulating layer 9.

In the embodiments of the present invention, the organic semiconductor layer of an organic thin film transistor having a top gate structure is formed by using a blade-coating process.

For example, the solution may also dissolve a high molecule polymer insulating material.

In the embodiments of the present invention, with an organic thin film transistor having a bottom gate structure as an example, a prepared organic mixed solution of an organic semiconductor material and a high molecule polymer insulating material is blade-coated on the substrate through a blade-coating process, the mixed solution stays in the hydrophilic region of the substrate, phase separation is incurred under the action of the shear force, and the organic semiconductor thin film is formed, i.e., an organic semiconductor layer and a high molecule polymer insulating layer are formed. Thus, a high molecule polymer insulating layer is formed between the organic semiconductor layer and a gate insulating layer, thereby avoiding the carrier traps of the hydroxyl groups on the gate insulating layer and greatly reducing the lag phenomenon.

The organic semiconductor material in the embodiments of the present invention may be, for example, 6,13-bis(triisopropylsilyl ethynyl)pentacene (TIPS-pentacene), 6,13-bis(trialkylsilyl ethynyl)bisthiophene anthracene and derivatives thereof, alkyl substituted benzothiophene and benzothiophene or alkyl-substituted sexithiophene ($\alpha$-6T) or the like. The high molecule polymer insulating material may be, for example, polymethyl methacrylate (PMMA), poly (butyl methacrylate), poly(methyl acrylate), polystyrene (PS), poly-$\alpha$-methylstyrene (PMS).

The technical solutions of the embodiments of the present invention may be used not only for preparation of an organic thin film transistor on an ordinary substrate, but also for preparation of an organic thin film transistor on a flexible substrate or an irregularly-shaped substrate. As for a flexible substrate, it only needs to place the flexible substrate tightly close to the platform for placing the substrate, so that the blade can conduct blade-coating on the surface of the flexible substrate. Similarly, it is also applicable for an irregularly-shaped substrate, and a relatively large blade may be used; and the length of the blade is greater than or equal to the maximum width of the irregularly-shaped substrate. For example, when the irregularly-shaped substrate is in a trapezoidal shape, the length of the blade may be adjusted to be greater than or equal to the longest side of the trapezoid, for the purpose of making the blade bring the organic solution to cover over entire surface of the substrate.

For example, the organic semiconductor material is 6,13-bis(triisopropylsilyl ethynyl)pentacene, and the polymer insulating material is polystyrene or polymethyl methacrylate; the mass ratio of the 6,13-bis(triisopropylsilyl ethynyl)pentacene to the polymer insulating material is 1:1, and the total mass concentration percentage of the 6,13-bis(triisopropylsilyl ethynyl)pentacene and the polymer insulating material in the solution is 2%.

The solutes in the solution are, for example, an organic semiconductor material and a high molecule polymer insulating material. The organic semiconductor material is used to form an organic semiconductor layer of the organic thin film transistor, while the high molecule polymer insulating material is used to form an interface modification layer between the organic semiconductor layer and a gate insulating layer of the organic thin film transistor. Preferably, the organic semiconductor material is 6,13-bis(triisopropylsilyl ethynyl)pentacene, i.e., Tips-pentacene, and preferably, the insulating material may be a polymer of poly(methyl methacrylate) (PMMA) or polystyrene (PS); experiments show that, when the mass ratio of Tips-pentacene to the polymer insulating material is 1:1 meanwhile the total mass concentration percentage of the Tips-pentacene and the polymer insulating material in the solution is 2%, a desired technical effect can be obtained.

For example, the solvent of the solution is chlorobenzene or dichlorobenzene.

The solvent of the solution is used to dissolve an organic semiconductor material and a high molecule polymer insulating material, thus the solvent needs to meet the requirements of good solubility and volatility for the removal of the solvent. Preferably, the solvent may be chlorobenzene or dichlorobenzene; for example, dichlorobenzene may be o-dichlorobenzene, m-dichlorobenzene or p-dichlorobenzene.

For example, the substrate is a silicon substrate, a glass substrate or a plastic substrate.

The substrates for the embodiments of the present invention may select a substrate having a different base, as long as the substrate is desired for the preparation of an organic semiconductor layer of an organic thin film transistor, the preparing method of an organic thin film transistor of the present invention can be used, and preferably, the substrate is a silicon substrate, a glass substrate or a plastic substrate.

An embodiment of the present invention further relates to an organic thin film transistor comprising: a gate electrode, a gate insulating layer, an organic semiconductor layer and source-drain electrodes, which are sequentially arranged; the organic semiconductor layer is prepared by the preparing method of the above-mentioned organic thin film transistor. An embodiment of the present invention further relates to another type of organic thin film transistor comprising: source-drain electrodes, an organic semiconductor layer, a gate insulating layer and a gate electrode, which are sequentially arranged; the organic semiconductor layer is prepared by the preparing method of the above-mentioned organic thin film transistor.

In the present embodiment of the invention, with a bottom gate structure as an example, an organic thin film transistor prepared by the above-mentioned method comprises: a gate electrode, a gate insulating layer, an organic semiconductor layer and a source-drain electrode, which are sequentially arranged; the organic semiconductor layer is prepared by the preparing method of the above-mentioned organic thin film transistor. For example, the OTFT may further comprise a high molecule polymer insulating material layer located between the organic semiconductor layer and the gate insulating layer. When the solution of an organic semiconductor material and a high molecule polymer insulating material is blade-coated onto the gate insulating layer with a hydrophilic region and a hydrophobic region being formed on, the mixed solution stays in the hydrophilic region; and after desolvation, small molecule organic semiconductor material and the high molecule polymer insulating material are separated in layers, thus separately forming an organic semiconductor layer and a high molecule polymer insulating layer. The small molecule organic semiconductor materials is, for example, Tips-pentacene, the high molecule polymer insulating material is, for example, polymethyl methacrylate or polystyrene, and the polymer insulating layer is located between the organic semiconductor layer and the gate insulating layer. Other structures of an organic thin film transistor, such as a gate electrode, a gate insulating layer and source-drain electrodes may be prepared by using an existing method for preparing an organic thin film transistor. Likewise, an organic thin film transistor having a top gate structure may also be prepared by using the method described above.

An embodiment of the invention further relates to applications of the preparing method of the above-mentioned organic thin film transistor in the manufacture of display devices. The display devices may be, for example, liquid crystal panels, electronic papers, OLED panels, liquid crystal televisions, liquid crystal displays, digital frames, mobile phones, tablet computers, and products or assemblies having any display functions.

An embodiment of the present invention further relates to a preparation equipment applied to the preparing method of an organic thin film transistor, comprising: a blade and a movement control device; the movement control device is used to control the blade to contact the substrate and control the blade to move relatively to the substrate, use the blade to blade-coat the solution in which the organic semiconductor material used to form the organic semiconductor layer is dissolved on the substrate and control the linear velocity between the blade and all contact points of the substrate be the same.

The preparation equipments of the embodiments of the present invention applied to the preparing method of the organic thin film transistor may be various, and the following two devices are illustrated as examples.

Figure 1:
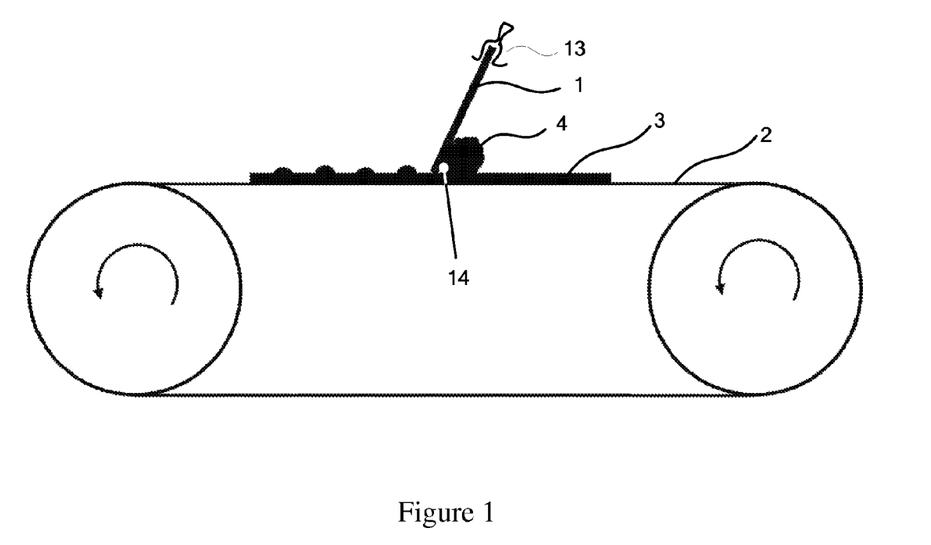
FIG. 1 is a schematic structural diagram of a preparation equipment corresponding to a preparing method of an organic thin film transistor according to the present invention.

As illustrated by FIG. 1, a preparation equipment is involved in an embodiment of the present invention, comprising: a blade 1, a fixture for fixing the blade (not shown), and a conveyor 2 for placing a substrate 3. The work principle of the device is described as follows: placing the substrate 3 on the conveyor 2, mounting and fixing the blade 1 on the fixture corresponding to the substrate 3, for example, with an angle between the blade 1 and the substrate 3 within 30°-45°; if the size of the substrate is, for example, 2 cm×2 cm, then the length of the edge of the selected blade contacting the substrate is more than or equal to 2 cm, dropping enough amount of required solution 4 at one side of the substrate 3 close to the blade 1, starting a stepping motor in connection with the conveyor 2 to drive the substrate 3 to move towards to the blade 1 so that the blade 1 blade-coats the solution 4 at the edge of the substrate 3 until the solution 4 is blade-coated on the entire substrate. The blade 1 can be mounted and fixed on the fixture in a variety of mechanical methods.

An embodiment of the present invention further relates to another preparation equipment, comprising: a blade, a moving device for moving the blade, and a platform for placing a substrate thereon. The work principle of the blade-coating device is described as follows: a substrate is not moved but placed on the platform, but the blade can be moved with the movement of the moving device for controlling the movement of the blade, so as to complete the blade-coating process on the stationary substrate.

For example, the blade may be a silicon rubber blade. A silicon rubber blade has a smooth surface, a hard material, and a lower surface energy, which is not easy for the solution for blade-coating to be sticked thereto and suitable to use as a blade of blade-coating.

For example, the side of the blade facing the substrate is provided with a liquid dropping outlet. For example, the bottom of the blade may be provided with one liquid dropping outlet, so that the solution flows out through the liquid outlet; if the size of the substrate is very large, a plurality of liquid dropping outlets may be disposed, such as three, four, six, or the like. During blade-coating, the various amount of the liquid drops can be set only according to the size of the substrate, which does not cause the waste of the raw material and can reduce the production costs.

Hereafter, the specific embodiments are used to illustrate the preparing method of an organic thin film transistor according to the embodiments of the present invention.

(1) Treatment of the Surface of the Substrate

Figure 2:
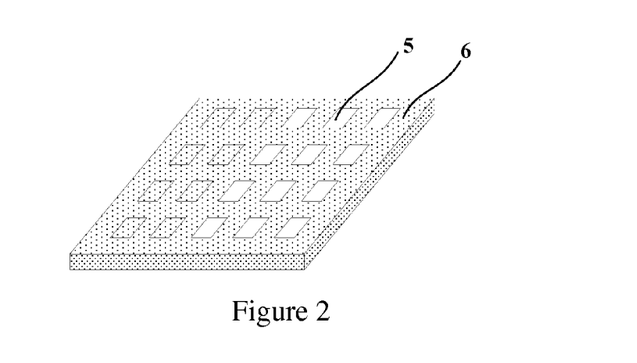
FIG. 2 is a schematic structural diagram of a substrate, on which a hydrophilic region and a hydrophobic region are formed, in a specific embodiment of the preparing method of an organic thin film transistor according to the present invention.

Under the protection of argon, trichloroacetic (1H, 1H, 2H, 2H-heptadecafluorodecyl alkyl) silane vapor is used to treat the entire blank substrate to form a single molecule layer, and then a mask with a pre-designed pattern to cover the substrate is adopted, and the mask and the substrate are placed together and treated in an ultraviolet ozone cleaning apparatus. As illustrated by FIG. 2, the region corresponding to the transmissive region of the mask forms a hydrophilic region 5, and the region corresponding to the non-transmissive region of the mask forms a hydrophobic region 6, thereby obtaining a substrate whose surface energy has an organic solution selectivity gradient.

(2) Preparation of an Organic Solution

Under the conditions of micro-heating and magnetic stirring, the small molecule organic semiconductor material and the high molecule polymer insulating material are dissolved in a excellent solvent (such as chlorobenzene, dichlorobenzene, etc.) for organic semiconductors and high molecule polymers, and sufficiently dissolved, placed in standing, and filted to obtain a mixed solution of the small molecule organic semiconductor material and high molecule polymer insulating material. The small molecule organic semiconductor material may be selected from 6,13-bis(triisopropylsilyl ethynyl)pentacene, 6,13-bis(trialkylsilyl ethynyl)anthracene bisthiophene and derivatives thereof, alkyl-substituted benzothiophene or alkyl-substituted sexithiophene (α-6T), etc.; the high molecule polymer insulating material may be selected from polymer polymethyl methacrylate (PMMA), poly(butyl methacrylate), poly(methyl acrylate), polystyrene (PS), poly-α-methylstyrene (PMS) and the like. The following embodiments only use Tips-pentacene as a representation of the small molecule organic semiconductor material, and use polystyrene or polymethyl methacrylate polymer as a representation of the high molecule polymer insulating material to illustrate.

(3) Preparation of an Organic Thin Film Transistor

First Embodiment

Tips-pentacene and polystyrene (PS) with a mass ratio of 1:1 are dissolved in chlorobenzene in 40, placed in standing, and filtered to form a mixed solution in which the total mass concentration percentage of Tips-pentacene and polystyrene (PS) is 2%; sufficient amount of solution is dropped at the edge of a silicon substrate, slowly and evenly blade-coated on the silicon substrate at a velocity of 0.5 mm/s to realize selectively patterning, and then sufficiently dried in a vacuum environment to form a film. A metal mask is used to cover the devices which have been self-assembled, and a gold electrode with a thickness of 50-100 nm is formed as the source-drain electrodes by a thermal evaporation method.

Second Embodiment

Tips-pentacene and polystyrene (PS) with a mass ratio of 1:1 are dissolved in chlorobenzene in 40, placed in standing, and filtered to form an organic solution in which the total mass concentration percentage of Tips-pentacene and polystyrene (PS) is 2%; sufficient amount of solution is dropped at the edge of a silicon substrate, slowly and evenly blade-coated on the silicon substrate at a velocity of 5 cm/s with help of an additional blade-coating device to realize selectively patterning, and then sufficiently dried in a vacuum environment to form a film. A metal mask is used to cover the devices which have been self-assembled, and a gold electrode with a thickness of 50-100 nm is formed as the source-drain electrodes by a thermal evaporation method.

Third Embodiment

Tips-pentacene and polystyrene (PS) with a mass ratio of 1:1 are dissolved in dichlorobenzene in 40, placed in standing, and filtered to form a mixed solution in which the total mass concentration percentage of Tips-pentacene and polystyrene (PS) is 2%; sufficient amount of solution is dropped at the edge of a silicon substrate, slowly and evenly blade-coated on the silicon substrate at a velocity of 1 cm/s to realize selectively patterning, and then sufficiently dried in a vacuum environment to form a film. A metal mask is used to cover the devices which have been self-assembled, and a gold electrode with a thickness of 50-100 nm is formed as the source-drain electrodes by a thermal evaporation method.

Fourth Embodiment

Tips-pentacene and polystyrene (PS) with a mass ratio of 1:1 are dissolved in dichlorobenzene in 40, placed in standing, and filtered to form a mixed solution in which the total mass concentration percentage of Tips-pentacene and polystyrene (PS) is 2%; sufficient amount of solution is dropped at the edge of a silicon substrate, slowly and evenly blade-coated on the silicon substrate at a velocity of 5 mm/s to realize selectively patterning, and then sufficiently dried in a vacuum environment to form a film. A metal mask is used to cover the devices which have been self-assembled, and a gold electrode with a thickness of 50-100 nm is formed as the source-drain electrodes by a thermal evaporation method.

Fifth Embodiment

Tips-pentacene and poly(methyl methacrylate) (PMMA) with a mass ratio of 1:1 are dissolved in dichlorobenzene in 40, placed in standing, and filtered to form a mixed solution in which the total mass concentration percentage of Tips-pentacene and poly(methyl methacrylate) (PMMA) is 2%; sufficient amount of solution is dropped at the edge of a silicon substrate, slowly and evenly blade-coated on the silicon substrate at a velocity of 5 mm/s to realize selectively patterning, and then sufficiently dried in a vacuum environment to form a film. A metal mask is used to cover the devices which have been self-assembled, and a gold electrode with a thickness of 50-100 nm is formed as the source-drain electrodes by a thermal evaporation method.

Sixth Embodiment

Tips-pentacene and poly(methyl methacrylate) (PMMA) with a mass ratio of 1:1 are dissolved in dichlorobenzene in 40, placed in standing, and filtered to form a mixed solution in which the total mass concentration percentage of Tips-pentacene and poly(methyl methacrylate) (PMMA) is 2%; sufficient amount of solution is dropped at the edge of a silicon substrate, slowly and evenly blade-coated on the silicon substrate at a velocity of 1 cm/s to realize selectively patterning, and then sufficiently dried in a vacuum environment to form a film. A metal mask is used to cover the devices which have been self-assembled, and a gold electrode with a thickness of 50-100 nm is formed as the source-drain electrodes by a thermal evaporation method.

Seventh Embodiment

Tips-pentacene and polystyrene (PS) with a mass ratio of 1:1 are dissolved in chlorobenzene in 40, placed in standing, and filtered to form a mixed solution in which the total mass concentration percentage of Tips-pentacene and polystyrene (PS) is 2%; sufficient amount of solution is dropped at the edge of a glass substrate, slowly and evenly blade-coated on the silicon substrate at a velocity of 0.5 mm/s to realize selectively patterning, and then sufficiently dried in a vacuum environment to form a film. A metal mask is used to cover the devices which have been self-assembled, and a gold electrode with a thickness of 50-100 nm is formed as the source-drain electrodes by a thermal evaporation method.

Eighth Embodiment

Tips-pentacene and polystyrene (PS) with a mass ratio of 1:1 are dissolved in chlorobenzene in 40, placed in standing, and filtered to form a mixed solution in which the total mass concentration percentage of Tips-pentacene and polystyrene (PS) is 2%; sufficient amount of solution is dropped at the edge of a plastic substrate, the plastic substrate may select a polyester substrate (PET substrate), slowly and evenly blade-coated on the silicon substrate at a velocity of 0.5 mm/s to realize selectively patterning, and then sufficiently dried in a vacuum environment to form a film. A metal mask is used to cover the devices which have been self-assembled, and a gold electrode with a thickness of 50-100 nm is formed as the source-drain electrodes by a thermal evaporation method.

First Comparative Example

Pure Tips-pentacene is dissolved in dichlorobenzene in 40, and stood to form a solution in which the mass concentration percentage of Tips-pentacene is 2%; the solution is spin-coated onto a pretreated substrate at a velocity of 1000 r/min to realize selectively patterning, and then sufficiently dried in a vacuum environment to form a film. A metal mask is used to cover the devices which have been self-assembled, and a gold electrode with a thickness of 50-100 nm is formed as the source-drain electrodes by a thermal evaporation method.

Second Comparative Example

Tips-pentacene and poly(methyl methacrylate) (PMMA) with a mass ratio of 1:1 are dissolved in dichlorobenzene in 80, placed in standing, and filtered to form a solution in which the total mass concentration percentage is 2%; the solution is spin-coated onto a pretreated substrate at a velocity of 3500 r/min to realize selectively patterning, and then sufficiently dried in a vacuum environment to form a film. A metal mask is used to cover the devices which have been self-assembled, and a gold electrode with a thickness of 50-100 nm is formed as the source-drain electrodes by a thermal evaporation method.

Figure 3:
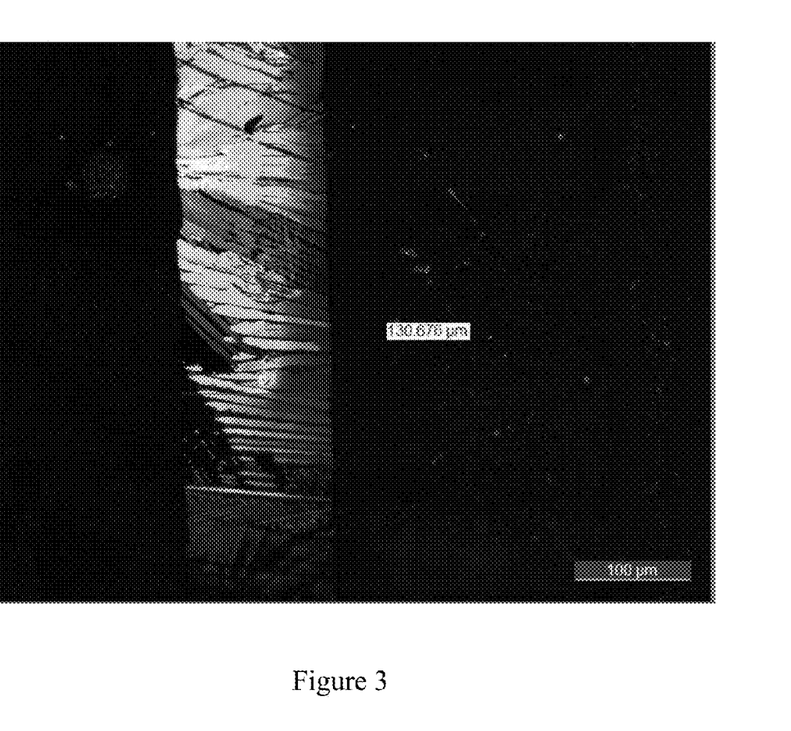
FIG. 3 is a 20-times polarization microscope image of an organic thin film transistor device prepared in the fifth embodiment of the present invention.
Figure 4:
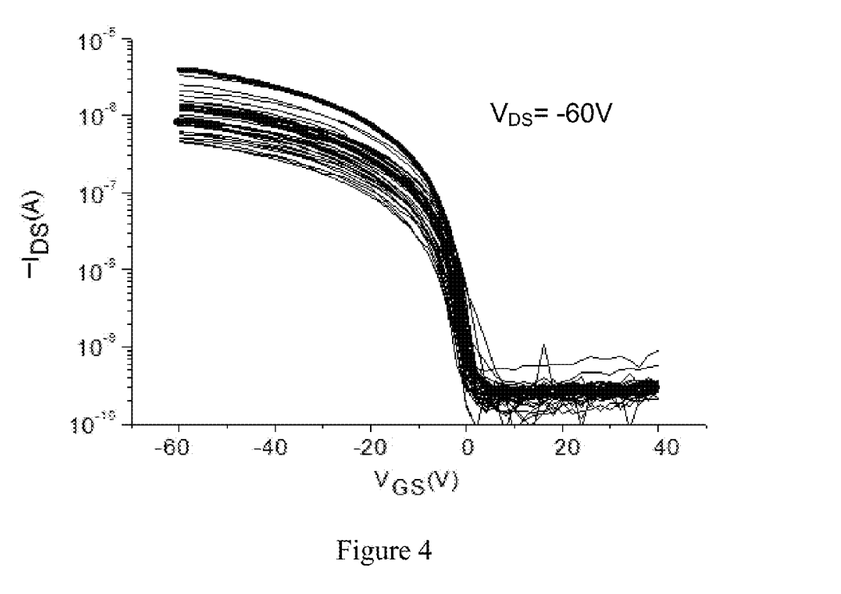
FIG. 4 is a transfer-curve diagram of a plurality of organic thin film transistor devices prepared in the fifth embodiment of the present invention.
Figure 5:
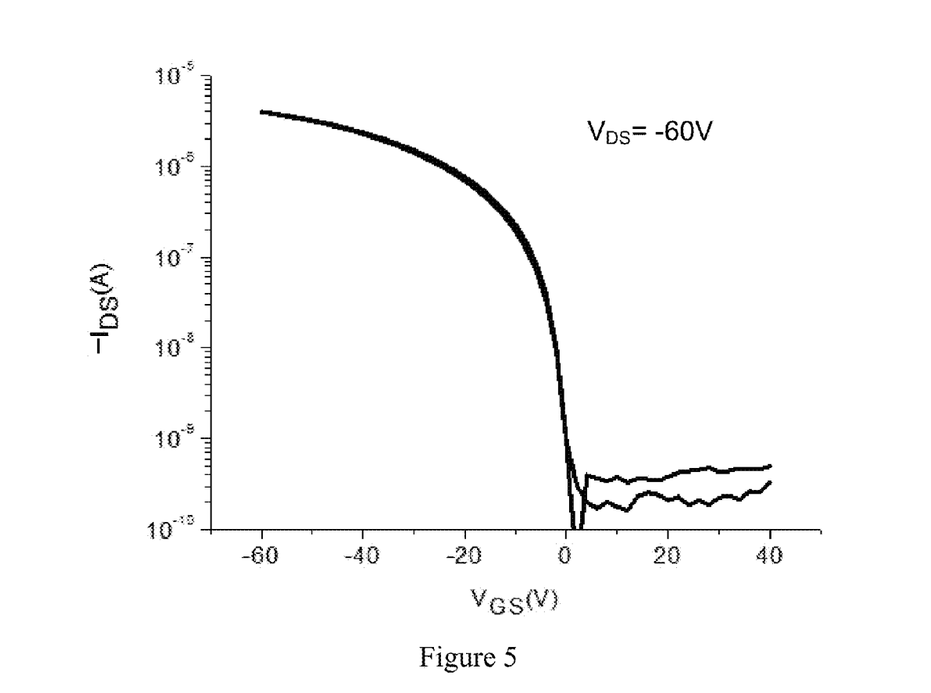
FIG. 5 is a bidirectional transfer-curve diagram of an optimal organic thin film transistor device prepared in the fifth embodiment of the present invention.
Figure 6:
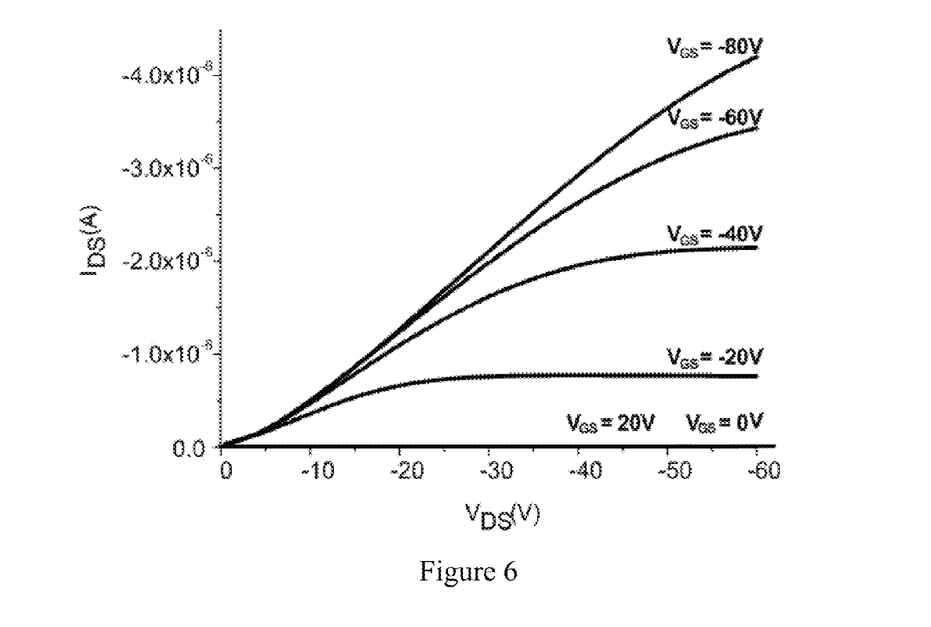
FIG. 6 is an output-curve diagram of the optimal organic thin film transistor device prepared in the fifth embodiment of the present invention.

The organic thin film transistors of the first~seventh embodiments and the first~second comparative examples are photographed with a polarization microscope and tested for device performance. FIG. 3 is a 20-times polarization microscope image of an organic thin film transistor device prepared in the fifth embodiment of the present invention. It can be seen that, in the channel, Tips-pentacene is neatly arranged in a palisade configuration, which indicates that the crystallinity of the Tip-pentacene is good. FIG. 4 is a transfer-curve diagram of the plurality of organic thin film transistor devices prepared in the fifth embodiment of the present invention; the bold black curve is the optimal device transfer curve graph, as to which the yield is 43/48=89.58%, thus the yield of the good device is largely improved, the uniformity of the performance of the device is also improved, and the best performance and the worst performance span about one order of magnitude; FIG. 5 is a bidirectional transfer-curve diagram of an optimal device prepared in the fifth embodiment of the present invention, it can be seen that the lag phenomenon does not exist; FIG. 6 is an output-curve diagram of the optimal device prepared in the fifth embodiment of the present invention. The 20-times polarization microscope images of the single organic thin film transistor devices separately prepared by the first-~fourth and sixth~eighth embodiments are similar to FIG. 3, which also indicate that the crystallinity of Tips-pentacene is relatively good and are not repeated here one by one. According to the measurement and calculation, the yields of the organic thin film transistor devices that are respectively prepared by the first~fourth and sixth~eighth embodiments are 92%, 86%, 91%, 94%, 90%, 91%, and 84% accordingly. It can be seen that the yields of the devices according to the embodiments of the present invention are relatively high and the performance of the devices is relatively uniform.

Figure 7:
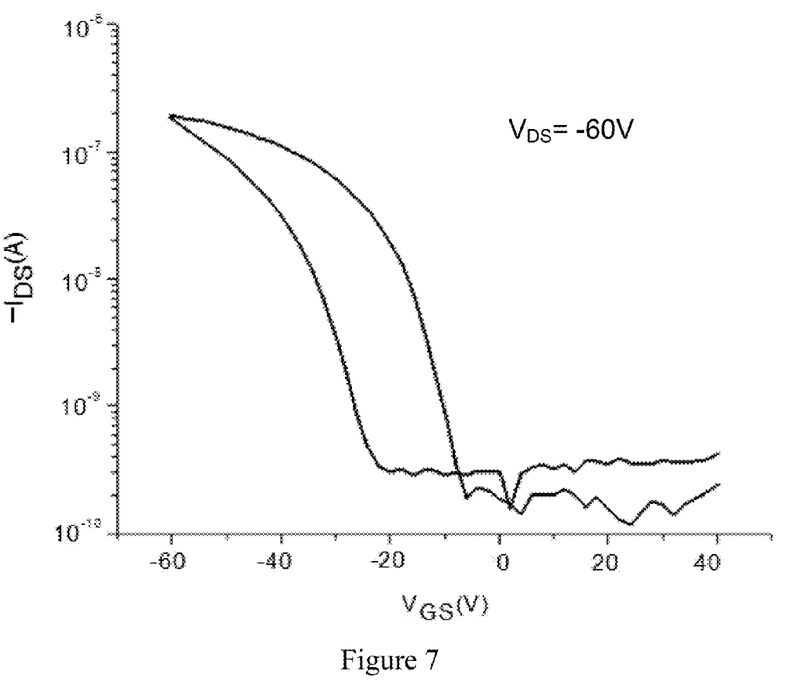
FIG. 7 is a bidirectional transfer-curve diagram of an organic thin film transistor device prepared in the first comparative example of the present invention.
Figure 8:
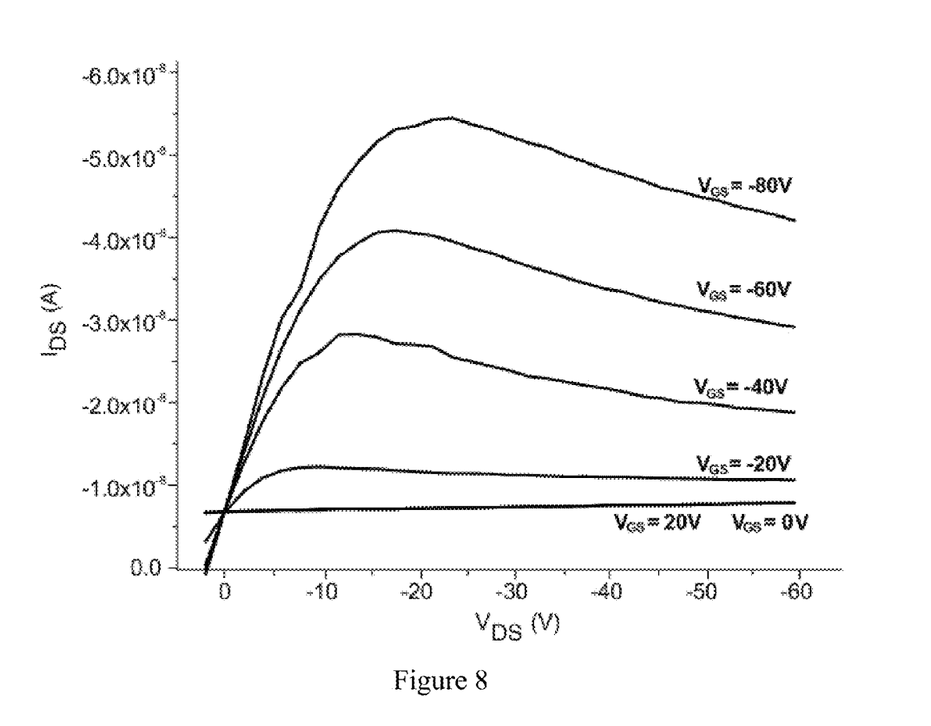
FIG. 8 is an output-curve diagram of the organic thin film transistor device prepared in the first comparative example of the present invention.
Figure 9:
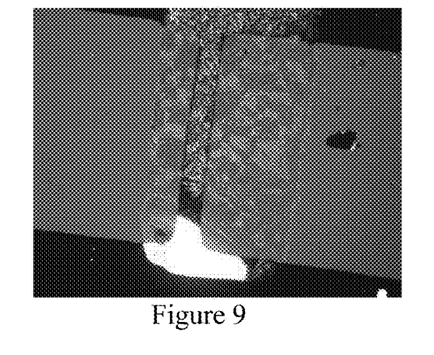
FIG. 9 is a polarization microscope image of an organic thin film transistor device prepared in the second comparative example of the present invention.
Figure 10:
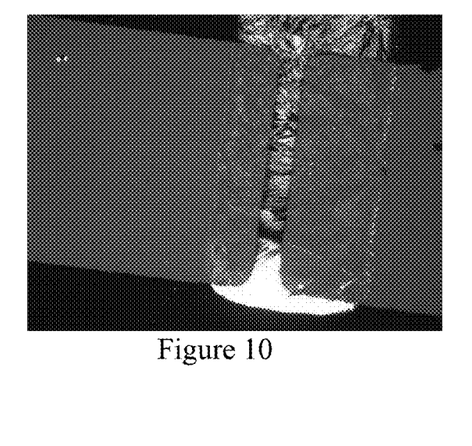
FIG. 10 is a polarization microscope image of another organic thin film transistor device prepared in the second comparative example of the present invention.
Figure 11:
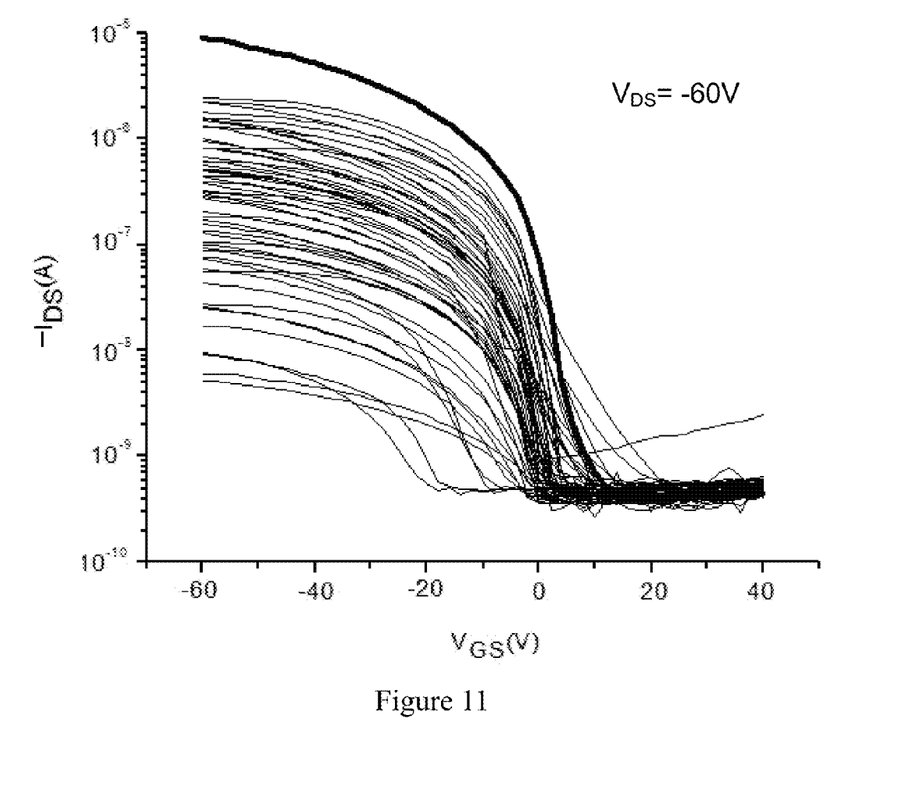
FIG. 11 is a transfer-curve diagram of a plurality of organic thin film transistor devices prepared in the second comparative example of the present invention.

An organic thin film transistor device is fabricated by using a spin-coating process of the prior art, FIG. 7 is a bidirectional transfer-curve diagram of the organic thin film transistor device prepared in the first comparative example of the present invention; FIG. 8 is an output-curve diagram of the organic thin film transistor device prepared in the first comparative example of the present invention; it can be seen that the performance of the device of the comparative example is bad, the ohmic contact is bad, and a big lag phenomenon exists. The second comparative example uses a spin-coating method to prepare an organic thin film transistor; during the rotation (spinning), differences between the devices are generated because respective linear velocities at them are different, and the devices that are close to the center of the substrate have better crystallinity, but the crystallinity of the devices at an edge or a corner is much worse than that of the devices close to the center of the substrate. That is, Tips-pentacene and PMMA in the hydrophilic regions of the edge or the corner are exposed, and the high molecule polymer layer can not be well distributed between the organic semiconductor layer and the gate insulating layer. FIG. 9 is a polarization microscope image of an uneven device in the second comparative example of the present invention; the lower left bright region is a place where Tips-pentacene stacks and the crystalline condition of the Tips-pentacene in the upper region in the image is much worse than that in the bright region. FIG. 10 is a polarization microscope image of a device whose crystalline directions are disorganized prepared in the second comparative example of the present invention; it can be seen that, firstly, the crystallization of the organic semiconductor material in the device is not uniform, and secondly, there is no so-called crystallization directivity in the bright region and the middle and upper regions in the image. FIG. 11 is a transfer-curve diagram of a plurality of organic thin film transistor devices prepared in the second comparative example of the present invention; it can be obtained that the probability of the work of the devices is 58/216=26.85%, the yield of the device is small, and the performance is uneven, and the difference between the best device and the worst device is of about three orders of magnitude.

The above are merely exemplary implementations of the present invention, but not for limiting the scope of the invention; instead, the scope of the invention should be defined by the appended claims.

The invention claimed is:

1. A preparing method of an organic thin film transistor, comprising:

forming a gate electrode, a gate insulating layer, an organic semiconductor layer, and source-drain electrodes on a substrate;
wherein the step of forming the organic semiconductor layer comprises:
forming a hydrophilic region in a region of a surface of the substrate corresponding to a transmissive region of a mask and a hydrophobic region in a region of the surface of the substrate corresponding to a non-transmissive region of the mask, and blade-coating a solution in which an organic semiconductor material used to form the organic semiconductor layer is dissolved on the substrate, the solution stays in the hydrophilic region of the substrate to form the organic semiconductor layer.

2. The preparing method of an organic thin film transistor according to claim 1, wherein a linear velocity is any velocity selected from 0.5 mm/s~5 cm/s.

3. The preparing method of an organic thin film transistor according to claim 2, wherein the linear velocity is 5 mm/s.

4. The preparing method of an organic thin film transistor according to claim 1, wherein forming the gate electrode, the gate insulating layer, the organic semiconductor layer, and the source-drain electrodes comprises:
forming the gate electrode on a surface of the substrate;
covering the gate insulating layer onto the surface of the substrate with the gate electrode being formed thereon;
forming the organic semiconductor layer on a surface of the gate insulating layer; and
forming the source-drain electrodes on a surface of the organic semiconductor layer.

5. The preparing method of an organic thin film transistor according to claim 1, wherein forming the gate electrode, the gate insulating layer, the organic semiconductor layer, and the source-drain electrodes comprises:
forming the source-drain electrodes on a surface of the substrate;
covering the organic semiconductor layer onto the surface of the substrate with the source-drain electrodes being formed thereon;
forming the gate insulating layer on a surface of organic semiconductor layer; and
forming the gate electrode on a surface of the gate insulating layer.

6. The preparing method of an organic thin film transistor according to claim 1, wherein a high molecule polymer insulating material is further dissolved in the solution.

7. The preparing method of an organic thin film transistor according to claim 6, wherein the organic semiconductor material is 6,13-bis(triisopropylsilyl ethynyl)pentacene, the high molecule polymer insulating material is polymethyl methacrylate or polystyrene, a mass ratio of the 6,13-bis(triisopropylsilyl ethynyl)pentacene to the high molecule polymer insulating material is 1:1, and a total mass concentration percentage of the 6,13-bis(triisopropylsilyl ethynyl) pentacene and the high molecule polymer insulating material is 2% in the solution.

8. The preparing method of an organic thin film transistor according to claim 1, wherein a solvent of the solution is chlorobenzene or dichlorobenzene.

9. The preparing method of an organic thin film transistor according to claim 1, wherein the substrate is a silicon substrate, a glass substrate, or a plastic substrate.

10. An organic thin film transistor, comprising an organic semiconductor layer, wherein the organic semiconductor layer is prepared through the method according to claim 1.

11. The organic thin film transistor according to claim 10, comprising: a gate electrode, a gate insulating, the organic semiconductor layer, and source-drain electrodes, which are sequentially arranged on a substrate.

12. The organic thin film transistor according to claim 10, comprising: source-drain electrodes, the organic semiconductor layer, a gate insulating layer, and a gate electrode, which are sequentially arranged on a substrate.

13. A preparation equipment applied for the preparing method of an organic thin film transistor according to claim 1, comprising:
a blade and a movement control device, wherein the movement control device is used to control the blade to contact a substrate and control the blade to move relatively to the substrate;
a surface of the substrate corresponding to the transmissive region of the mask is a hydrophilic region and a surface of the substrate corresponding to the non-transmissive region of the mask is a hydrophobic region; and
a solution in which an organic semiconductor material used to form an organic semiconductor layer is dissolved is blade-coated on the substrate with the blade, the solution stays in the hydrophilic region of the substrate to form the organic semiconductor layer.

14. The preparation equipment according to claim 13, wherein the movement control device comprises a fixture for fixing the blade and a conveyor for placing the substrate thereon.

15. The preparation equipment according to claim 13, wherein the movement control device comprises a moving device for moving the blade and a platform for placing the substrate thereon.

16. The preparation equipment according to claim 13, wherein the blade is a silicon rubber blade.

17. The preparation equipment according to claim 13, wherein a side of the blade facing the substrate is provided with a liquid dropping outlet.

18. The preparing method of an organic thin film transistor according to claim 1, wherein during a process of blade-coating the solution in which the organic semiconductor material used to form the organic semiconductor layer is dissolved to form the organic semiconductor layer, all contact points between a blade and the substrate have a same linear velocity.

* * * * *